United States Patent
Tenno et al.

(10) Patent No.: US 11,612,053 B2
(45) Date of Patent: Mar. 21, 2023

(54) CIRCUIT BOARD AND ELECTRONIC DEVICE

(71) Applicant: Murata Manufacturing Co., Ltd., Nagaokakyo (JP)

(72) Inventors: Nobuyuki Tenno, Nagaokakyo (JP); Takahiro Baba, Nagaokakyo (JP); Kuniaki Yosui, Nagaokakyo (JP); Yasuko Yoshinaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 110 days.

(21) Appl. No.: 17/326,386

(22) Filed: May 21, 2021

(65) Prior Publication Data

US 2021/0274647 A1  Sep. 2, 2021

Related U.S. Application Data

(63) Continuation of application No. PCT/JP2019/049502, filed on Dec. 18, 2019.

(30) Foreign Application Priority Data

Dec. 18, 2018 (JP) .............. JP2018-236686

(51) Int. Cl.
  *H05K 1/02* (2006.01)
  *H05K 1/14* (2006.01)
(52) U.S. Cl.
  CPC ......... *H05K 1/0237* (2013.01); *H05K 1/0228* (2013.01); *H05K 1/142* (2013.01)
(58) Field of Classification Search
  CPC ..... H05K 1/0237; H05K 1/0228; H05K 1/142
  See application file for complete search history.

(56) References Cited

U.S. PATENT DOCUMENTS

2002/0125566 A1  9/2002  Tonami et al.
2013/0155632 A1*  6/2013  Lo .................. H05K 1/028
                                                    361/749

(Continued)

FOREIGN PATENT DOCUMENTS

JP        01-297902 A    12/1989
JP        06-5998 A       1/1994

(Continued)

OTHER PUBLICATIONS

Official Communication issued in International Patent Application No. PCT/JP2019/049502, dated Feb. 4, 2020.

(Continued)

*Primary Examiner* — Hoa C Nguyen
(74) *Attorney, Agent, or Firm* — Keating & Bennett, LLP

(57) ABSTRACT

A circuit board includes a first circuit board portion and a second circuit board portion. The first circuit board portion is provided with a first transmission line for a low-frequency signal or a low-speed signal, and the second circuit board portion is provided with a second transmission line for a high-frequency signal or a high-speed signal. The second circuit board portion is located on the first circuit board portion in a positional relationship in which the first transmission line and the second transmission line are side-by-side with each other. With this structure, signal leakage and interference between different signals are reduced or prevented in a line that transmits signals with different frequencies and different transmission speeds.

20 Claims, 14 Drawing Sheets

(56) References Cited

U.S. PATENT DOCUMENTS

| | | |
|---|---|---|
| 2013/0235545 A1 | 9/2013 | Ohmi et al. |
| 2014/0204546 A1* | 7/2014 | Baker .................... H05K 1/024 |
| | | 156/308.2 |
| 2017/0033426 A1 | 2/2017 | Baba et al. |
| 2017/0084975 A1* | 3/2017 | Baba ....................... H01P 3/088 |
| 2017/0149111 A1* | 5/2017 | Yosui .................. H05K 1/0253 |
| 2018/0090827 A1* | 3/2018 | Lee ...................... H01Q 21/067 |
| 2019/0141831 A1* | 5/2019 | Baba .................. H05K 3/0058 |

FOREIGN PATENT DOCUMENTS

| | | |
|---|---|---|
| JP | 11-177245 A | 7/1999 |
| JP | 2002-261189 A | 9/2002 |
| WO | 2012/063918 A1 | 5/2012 |
| WO | 2016/088693 A1 | 6/2016 |
| WO | 2016/163436 A1 | 10/2016 |

OTHER PUBLICATIONS

Official Communication issued in corresponding Japanese Patent Application No. 2020-561475, dated Jul. 6, 2021.

\* cited by examiner

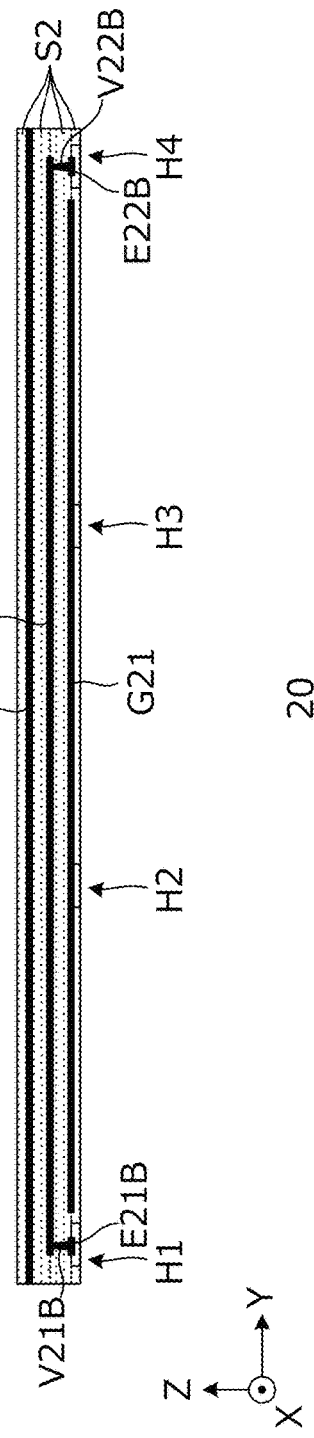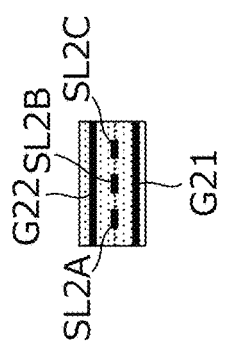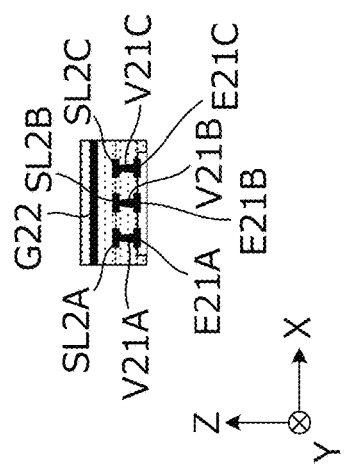

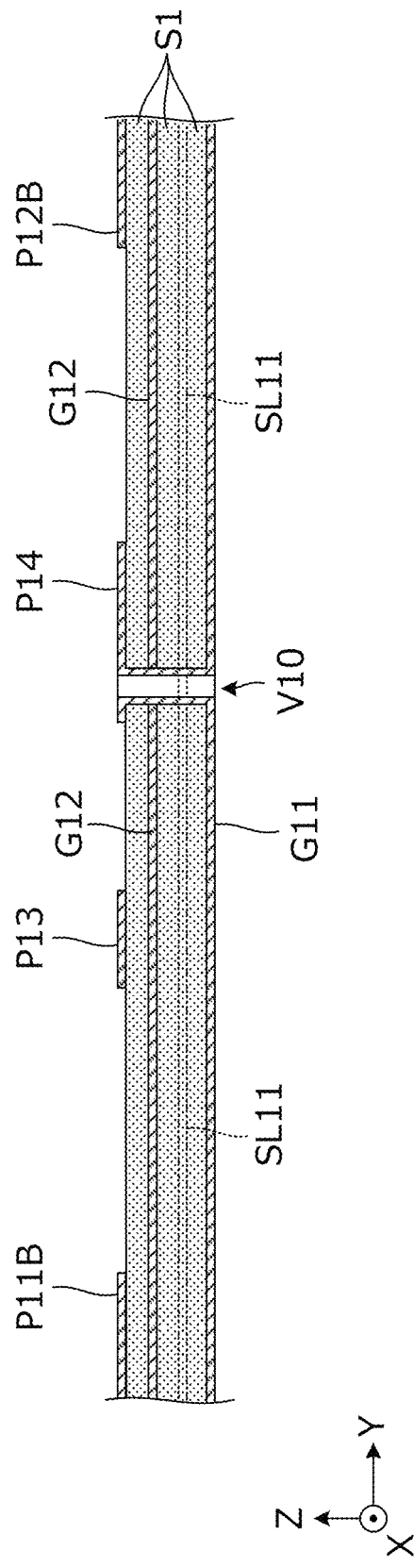
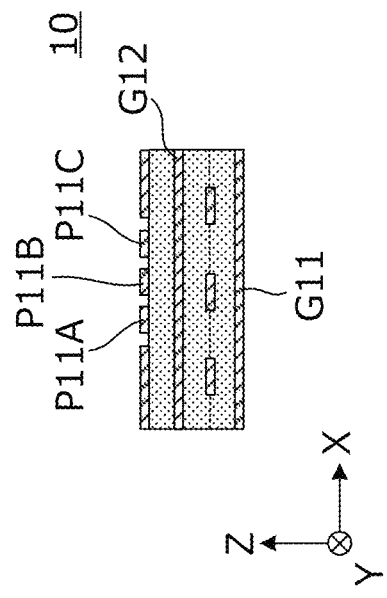
Fig.4A
Fig.4B

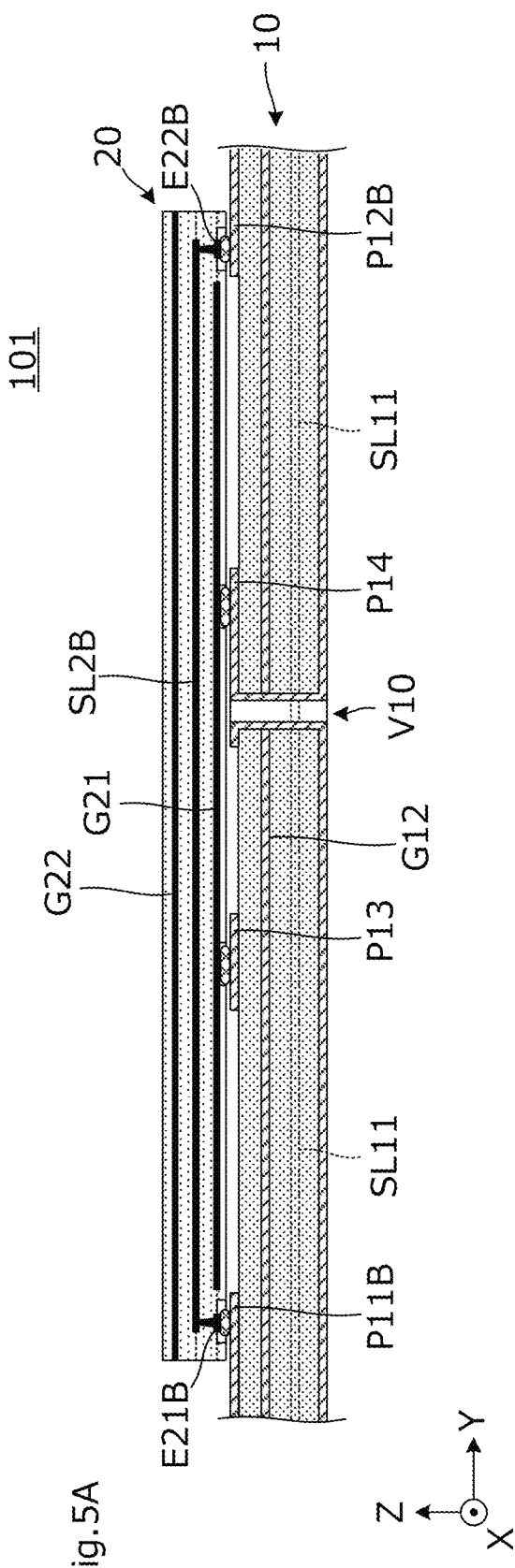
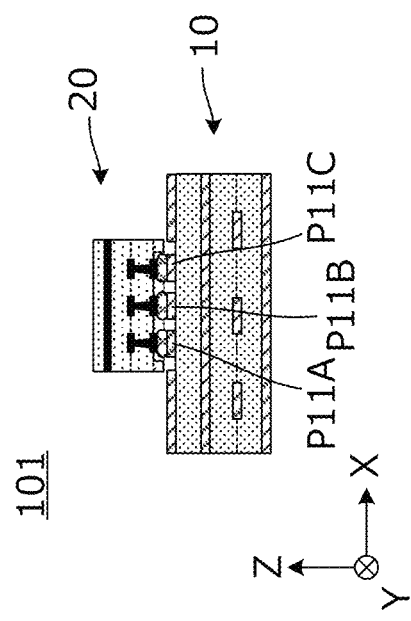

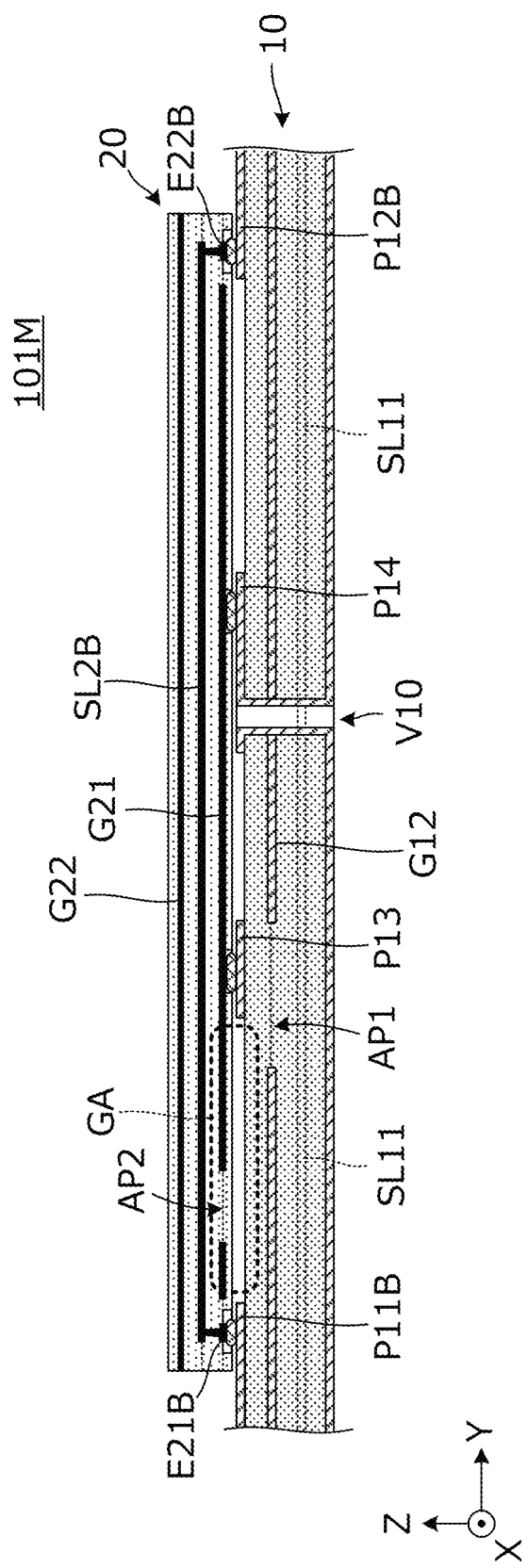

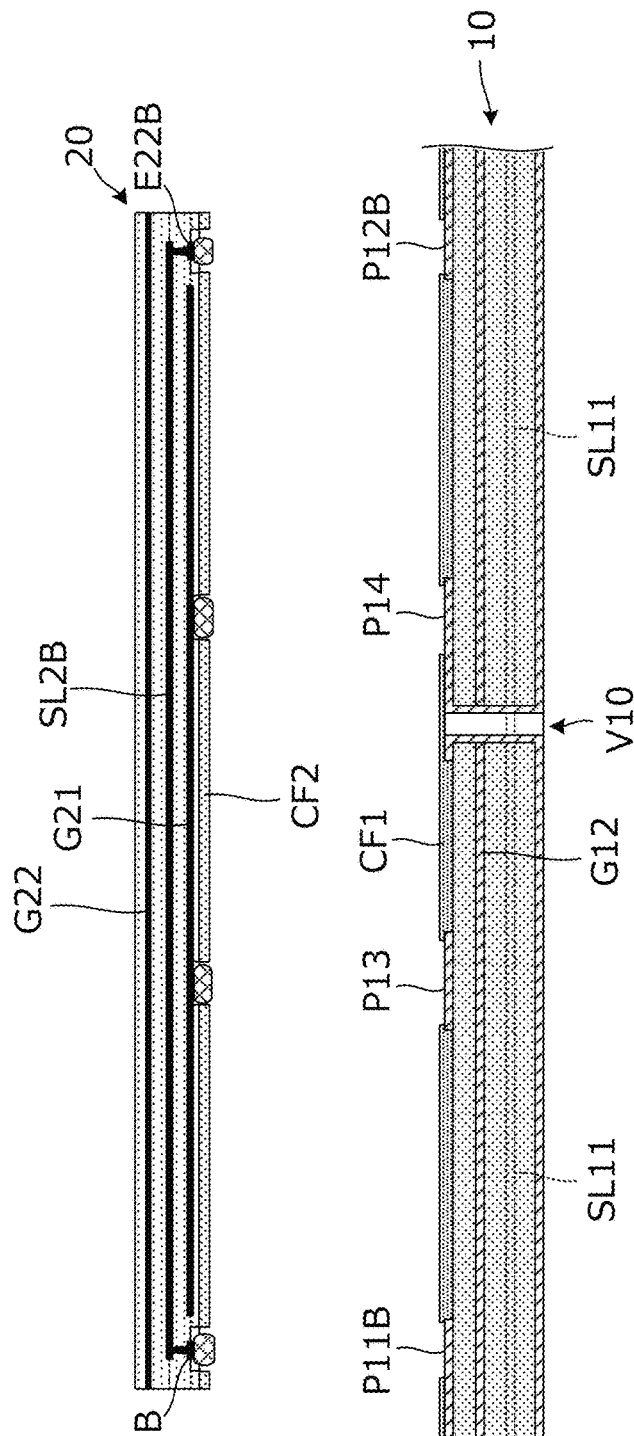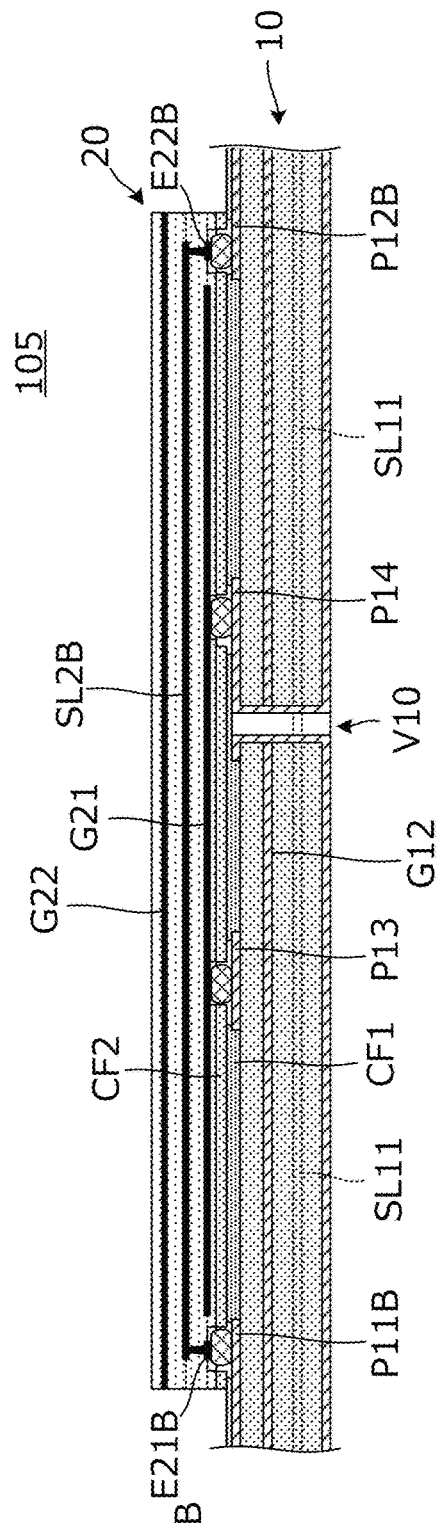

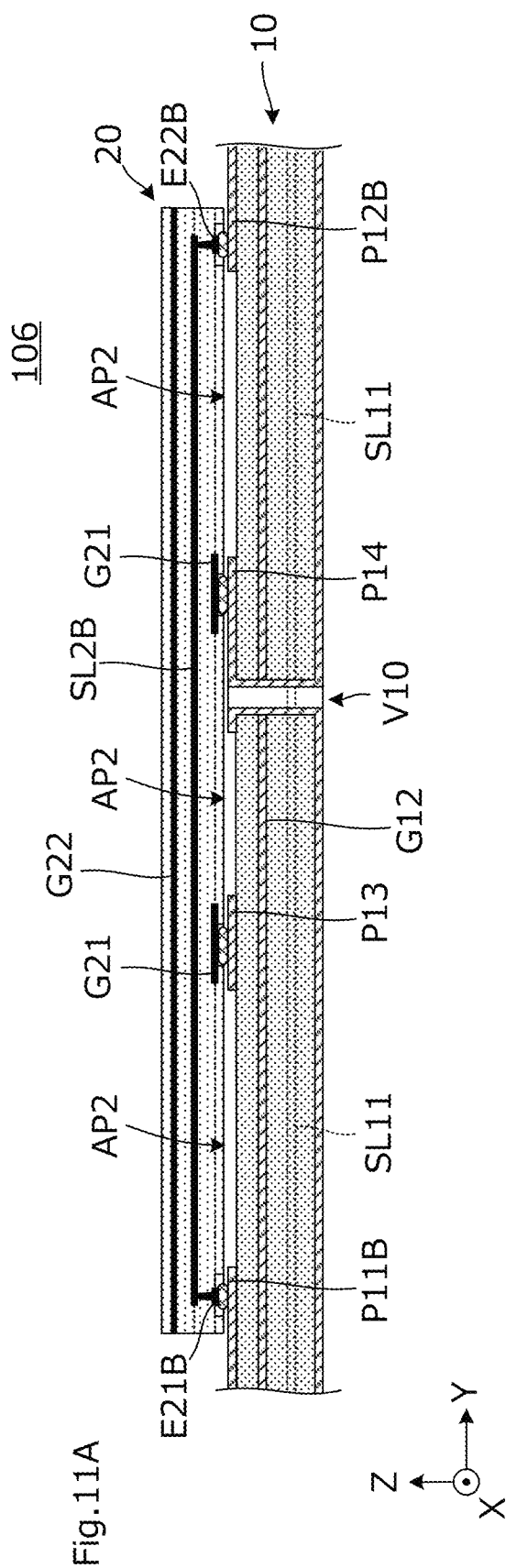
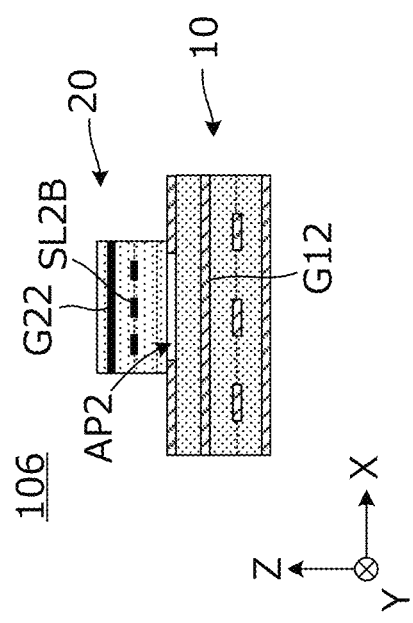
Fig.11A
Fig.11B

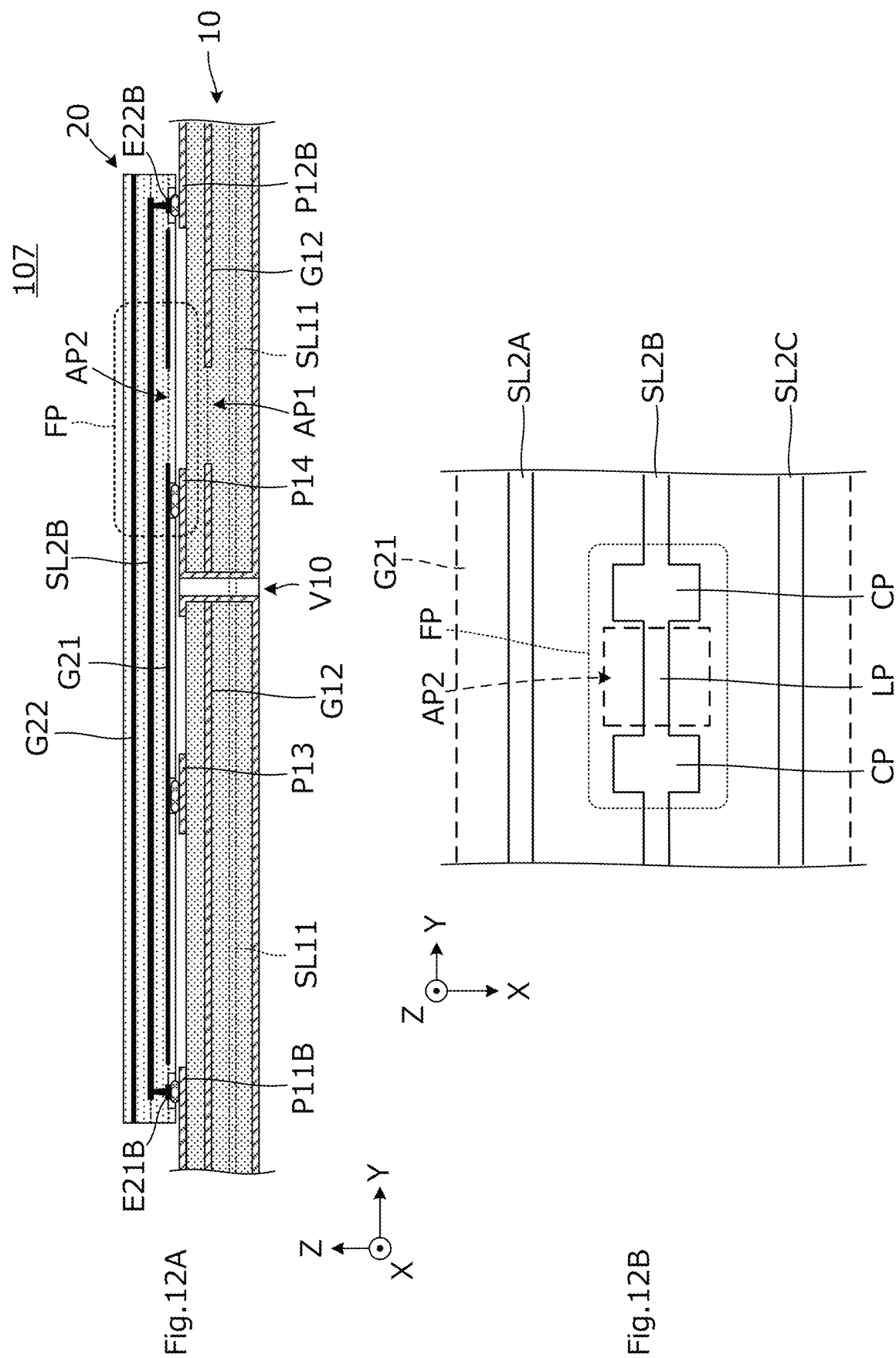

CIRCUIT BOARD AND ELECTRONIC DEVICE

CROSS REFERENCE TO RELATED APPLICATIONS

This application claims the benefit of priority to Japanese Patent Application No. 2018-236686 filed on Dec. 18, 2018 and is a Continuation Application of PCT Application No. PCT/JP2019/049502 filed on Dec. 18, 2019. The entire contents of each application are hereby incorporated herein by reference.

BACKGROUND OF THE INVENTION

1. Field of the Invention

The present invention relates to a circuit board usable in an electronic device and an electronic device including the circuit board.

2. Description of the Related Art

WO 2016/163436 A describes a composite transmission line that enables power transmission as well as signal transmission, and a composite transmission line that enables effective suppression of interference between lines.

SUMMARY OF THE INVENTION

In the composite transmission line described in WO 2016/163436 A, since a plurality of signal lines and a power supply line are configured as a single composite transmission line, the composite transmission line can be used as a cable enabling power transmission as well as a plurality of types of signal transmission, despite its small size.

However, in wireless communication devices such as mobile phone terminals and smartphones, it is necessary to handle a wide variety of signals. For example, analog signals ranging from low-frequency signals of several tens MHz to high-frequency signals of several GHz and digital signals ranging from low-speed signals of several tens Mbps to high-speed signals of several Gbps are handled. In such an electronic device, it is effective to configure a shared cable for transmitting a wide variety of signals, in terms of miniaturization of the electronic device.

However, when lines that transmit a plurality of signals having different frequencies and different transmission speeds are configured as, for example, a single cable having a multilayer substrate structure, a problem that the lines interfere with each other arises. For example, a signal propagating on a low-frequency/low-speed line may leak or be superimposed as noise on a high-frequency/high-speed line. If a line suitable for propagating low-frequency/low-speed signals and a line suitable for propagating high-frequency/high-speed signals have different configurations for insulating base materials and conductor patterns, a problem that predetermined characteristics cannot be obtained in one line arises.

Therefore, preferred embodiments of the present invention provide circuit boards that each reduce or prevent signal leakage and interference between different signals in lines that transmit a plurality of signals having different frequencies and different transmission speeds, and electronic devices including such circuit boards. Further, preferred embodiments of the present invention provide circuit boards each provided with lines that satisfy predetermined characteristics for the respective lines transmitting a plurality of signals having different frequencies and different transmission speeds, and electronic devices including such circuit boards.

A circuit board as one example embodiment of the present disclosure includes a plurality of circuit board portions including a first circuit board portion and a second circuit board portion, and the first circuit board portion is provided with a first transmission line for a low-frequency signal or a low-speed signal, the second circuit board portion is provided with a second transmission line for a high-frequency signal or a high-speed signal, and the second circuit board portion is disposed on the first circuit board portion in a positional relationship in which the first transmission line and the second transmission line extend side-by-side with each other.

A circuit board as one example embodiment of the present disclosure includes a plurality of circuit board portions including a first circuit board portion and a second circuit board portion, and the first circuit board is provided with a first transmission line for a low-frequency signal or a low-speed signal, the second circuit board portion is provided with a second transmission line for a high-frequency signal or a high-speed signal, the first transmission line includes a first signal line and a first ground conductor, the second transmission line includes a second signal line and a second ground conductor, the first ground conductor and the second ground conductor face each other in opposite regions, and the first signal line and the second signal line are outside the opposite regions.

An electronic device as one example embodiment of the present disclosure includes one of the circuit boards described above, a housing to accommodate the circuit board, and a component accommodated in the housing.

An entirety of one of the first circuit board portion and the second circuit board portion is located on the other, and the one protrudes from the other to define a stepped portion.

A portion or an entirety of the housing or the component is located in a space defined by the stepped portion.

According to example embodiments of the present disclosure, it is possible to obtain circuit boards in which signal leakage and interference between different signals are reduced or prevented in a line that is able to transmit a plurality of signals with different frequencies and transmission speeds, and to obtain electronic devices including such circuit boards. Further, it is possible to obtain circuit boards each including lines satisfying predetermined characteristics for each of the lines transmitting a plurality of signals with different frequencies and transmission speeds, and to obtain electronic devices including such circuit boards.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is a cross-sectional view of a second circuit board portion 20 in a longitudinal direction, and FIGS. 3B and 3C are cross-sectional views of the second circuit board portion 20 in a width direction.

FIG. 4A is a partial cross-sectional view of a first circuit board portion 10 in a Y direction. FIG. 4B is a cross-sectional view of the first circuit board portion 10 in the X direction.

FIG. 5A is a partial cross-sectional view of the circuit board 101 in the Y direction, and FIG. 5B is a cross-sectional view of the circuit board 101 in the X direction.

FIG. 6 is a partial cross-sectional view of another circuit board 101M according to the first preferred embodiment of the present invention.

FIG. 10A is a cross-sectional view of the first circuit board portion 10 and the second circuit board portion 20 that are elements of a circuit board 105 according to a fifth preferred embodiment of the present invention, and FIG. 10B is a cross-sectional view of the circuit board 105.

FIG. 11A is a cross-sectional view of a circuit board 106 according to a sixth preferred embodiment of the present invention in the Y direction, and FIG. 11B is a cross-sectional view of the circuit board 106 in the X direction.

FIG. 12A is a cross-sectional view of a circuit board 107 according to a seventh preferred embodiment of the present invention. FIG. 12B is a plan view showing a shape of a signal conductor of a filter portion FP and a shape of a ground conductor G21.

DETAILED DESCRIPTION OF THE PREFERRED EMBODIMENTS

Figure 1:
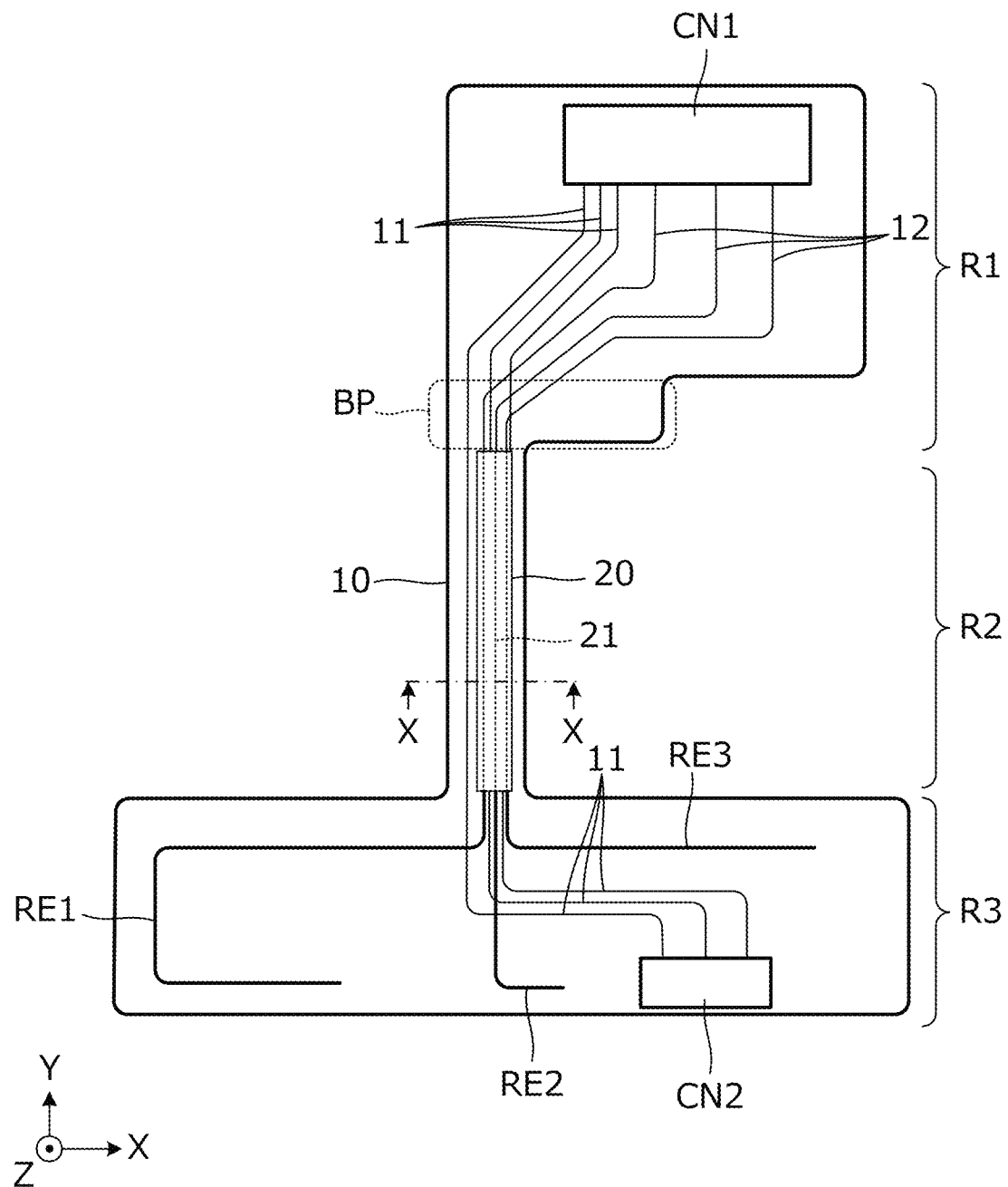
FIG. 1 is a plan view of a circuit board 101 according to a first preferred embodiment of the present invention.

First, some aspects of circuit boards according to preferred embodiments of the present invention will be described.

A circuit board according to a first aspect of a preferred embodiment of the present invention includes a plurality of circuit board portions including a first circuit board portion and a second circuit board portion. The first circuit board portion is provided with a first transmission line for a low-frequency signal or a low-speed signal, and the second circuit board portion is provided with a second transmission line for a high-frequency signal or a high-speed signal. The second circuit board portion is disposed on the first circuit board portion in a positional relation that the first transmission line and the second transmission line extend side-by-side with each other. According to this configuration, isolation between the first circuit board portion and the second circuit board portion is ensured, and signal leakage and interference between the first transmission line and the second transmission line are reduced or prevented. Further, predetermined transmission characteristics can be satisfied for each of the low-frequency/low-speed signal and the high-frequency/high-speed signal.

In a circuit board of a second aspect according to a preferred embodiment of the present invention, the dielectric constant of the first circuit board portion is higher than the dielectric constant of the second circuit board portion.

In a circuit board of a third aspect according to a preferred embodiment of the present invention, the first transmission line and the second transmission line extend side-by-side with each other so as to be aligned in a plane direction of the plurality of circuit board portions in a plan view. According to this configuration, isolation between the first circuit board portion and the second circuit board portion can be further enhanced.

In a circuit board of a fourth aspect according to a preferred embodiment of the present invention, the first transmission line and the second transmission line extend side-by-side with each other so as to be aligned in a stacked direction of the plurality of circuit board portions. According to this configuration, a width in the plane direction of a portion where the first circuit board portion and the second circuit board portion overlap with each other can be narrowed.

In a circuit board of a fifth aspect according to a preferred embodiment of the present invention, the first circuit board portion is mounted on the second circuit board portion and the second circuit board portion protrudes from the first circuit board portion to define a stepped portion, or the second circuit board portion is mounted on the first circuit board portion and the first circuit board portion protrudes from the second circuit board portion to define a stepped portion. According to this configuration, the overlapping portion between the first circuit board portion and the second circuit board portion becomes relatively thick. However, since the first circuit board portion or the second circuit board portion only partially protrudes, the occupied volume of the circuit board can be reduced, and an increase in the average thickness of an entire circuit board can be reduced or prevented. This can contribute to miniaturization of an electronic device.

In a circuit board of a sixth aspect according to a preferred embodiment of the present invention, a width of the second circuit board portion in a portion where the second transmission line is located is narrower than a width of the first circuit board portion, and the first circuit board portion protrudes from the second circuit board portion to define a stepped portion. According to this configuration, the thickness of the overlapping portion between the first transmission line and the second transmission line becomes relatively thick. However, since the second circuit board portion only partially protrudes as a stepped portion, the occupied volume of the circuit board can be reduced, and an increase in the average thickness of the entire circuit board can be reduced or prevented. This can contribute to miniaturization of an electronic device.

In a circuit board of a seventh aspect according to a preferred embodiment of the present invention, the first circuit board portion is a multilayer substrate in which a plurality of insulating base materials are stacked and which includes a first interlayer connection conductor, and the second circuit board portion is a multilayer substrate in which a plurality of insulating base materials are stacked and which includes a second interlayer connection conductor. The first interlayer connection conductor includes a metal body, and the second interlayer connection conductor includes, at least partially, a solidified material of a conductive paste. According to this configuration, a circuit board that includes a first circuit board portion including an interlayer connection conductor suitable for a first transmission line and a second circuit board portion including an interlayer connection conductor suitable for a second transmission line can be obtained.

In a circuit board of an eighth aspect according to a preferred embodiment of the present invention, the first circuit board portion or the second circuit board portion includes a ground conductor located between the first transmission line and the second transmission line. According to this configuration, since the first transmission line and the second transmission line are shielded by the ground conductor, isolation between the first transmission line and the second transmission line is further enhanced.

Further, the dielectric constant of the first circuit board portion is higher than the dielectric constant of the second circuit board portion.

Further, an insulator having a dielectric constant higher than that of the second circuit board portion is provided between a first ground conductor and a second ground conductor.

An electronic device of a ninth aspect according to a preferred embodiment of the present invention includes the circuit board according to the fifth or sixth aspect, a housing to accommodate the circuit board, and a component accommodated in the housing. The entirety of one of the first circuit board portion and the second circuit board portion is disposed on the other, the one protrudes from the other to define a stepped portion, and (a portion or the entirety of) the housing or the component is located in a space defined by the stepped portion. According to this configuration, no wasted space is generated due to the stepped portion of the circuit board, and a decrease in the degree of integration can be avoided.

Hereinafter, a plurality of preferred embodiments of the present invention will be described with use of some specific examples with reference to the drawings. The same reference numerals are given to the same portions in each figure. Although the preferred embodiments are shown separately for convenience of explanation in consideration of the explanation of the main points or the ease of understanding, partial replacement or combination of the configurations shown in different preferred embodiments is possible. In the second and subsequent preferred embodiments, the description of matters common to the first preferred embodiment will be omitted, and only the differences will be described. In particular, similar actions and effects with the same configuration will not be mentioned sequentially for each preferred embodiment.

First Preferred Embodiment

Figure 2A:
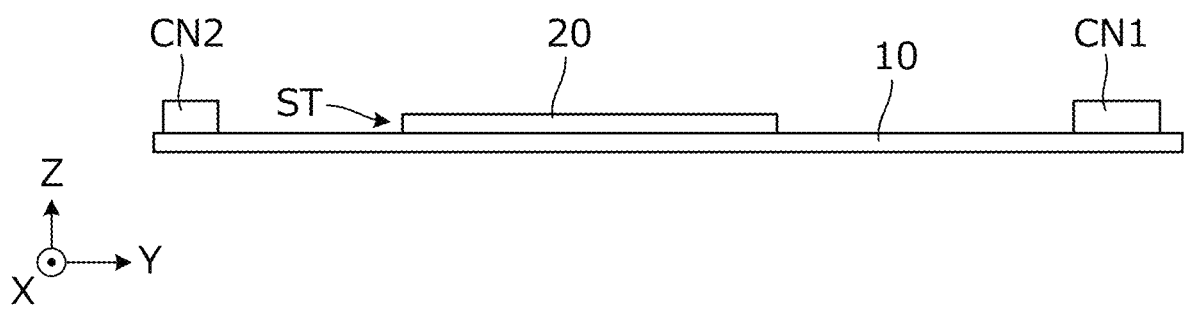
FIG. 2A is a side view of the circuit board 101.
Figure 2B:
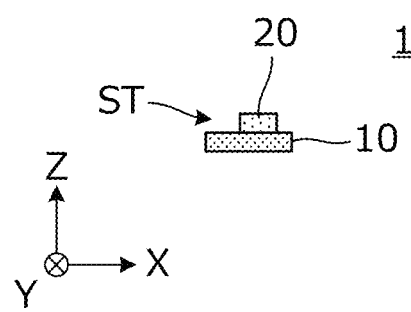
FIG. 2B is a cross-sectional view of an X-X part in FIG. 1.

FIG. 1 is a plan view of a circuit board 101 according to a first preferred embodiment of the present invention. FIG. 2A is a side view of the circuit board 101, and FIG. 2B is a cross-sectional view of an X-X part in FIG. 1. However, in FIG. 2B, illustration of an internal conductor pattern is omitted. In FIGS. 1, 2A, and 2B, X, Y, and Z represent three orthogonal axes. The meanings of X, Y, and Z are the same for the other figures shown below.

The circuit board 101 includes a first circuit board portion 10 and a second circuit board portion 20. The first circuit board portion 10 is a multilayer substrate in which the insulating base material includes a thermosetting resin sheet such as polyimide (PI) or modified polyimide, or a thermoplastic resin sheet such as polyethylene terephthalate (PET). The second circuit board portion 20 is a multilayer substrate in which the insulating base material is made of a flexible thermoplastic resin sheet having a low dielectric constant and low dielectric loss tangent such as liquid crystal polymer (LCP), polyetheretherketone (PEEK), or polytetrafluoroethylene (PTFE). The second circuit board portion 20 is mounted on the first circuit board portion 10.

A plurality of first transmission lines 11 for low-frequency signals or low-speed signals are located on the first circuit board portion 10. A plurality of second transmission lines 21 for high-frequency signals or high-speed signals are provided on the second circuit board portion 20.

The second circuit board portion 20 is disposed on the first circuit board portion 10 in a positional relationship in which the first transmission line 11 and the second transmission line 21 extend side-by-side with each other.

The circuit board 101 can be divided into a first region R1, a second region R2, and a third region R3. A connector (receptacle) CN1 connected to another circuit board is mounted in the first region R1. A portion of the first region R1 (the portion connected to the second region R2) is a bent portion BP. The second circuit board portion 20 is located (mounted) in the second region R2. Radiation elements RE1, RE2, and RE3 of three antennas are provided in the third region R3. Further, a connector (receptacle) CN2 connected to another circuit board is mounted in the third region R3. The bent portion BP may be thinner than the other portions of the first circuit board portion 10. As a result, the flexibility of the bent portion BP can be increased.

The connection with the other circuit board is not limited to a connector connection, but may be a solder connection. The other circuit board described above is an inexpensive rigid board such as FR4. Further, the connection destination of the circuit board 101 is not limited to another circuit board, and can be applied to the case where it is directly connected to the housing.

The first transmission lines 11 connecting the connector CN1 and the connector CN2 are located in the first circuit board portion 10. Further, a transmission line 12 that connects the connector CN1 and the second transmission line 21 of the second circuit board portion 20 is located in the first circuit board portion 10. The first transmission lines 11 and the transmission line 12 are located inside the first circuit board portion 10, but FIG. 1 conceptually shows the pattern of the signal conductors of the first transmission line 11 and the transmission line 12.

The second transmission line 21 in the second circuit board portion 20 is located inside the second circuit board portion 20, but FIG. 1 conceptually shows the pattern of the signal conductor of the second transmission line 21.

The first transmission line 11 and the second transmission line 21 extend side-by-side with each other so as to be aligned in the stacked direction (Z direction) of the first circuit board portion 10 and the second circuit board portion 20. The second transmission line 21 is connected to the transmission line 12 in a state where the second circuit board portion 20 is mounted on the first circuit board portion 10.

Each of the radiation elements RE1, RE2, and RE3 located in the third region R3 acts as, for example, a monopole antenna.

The circuit board 101 is accommodated in an electronic device in a state where the bent portion BP is bent. The connector CN1 is connected to a connector (plug) provided to another circuit board in the electronic device. Similarly, the connector CN2 is also connected to a connector (plug) provided to another circuit board in the electronic device.

As shown in FIGS. 2A and 2B, the entire second circuit board portion 20 is disposed on the first circuit board portion 10, and the second circuit board portion 20 protrudes from the first circuit board portion 10, such that a stepped portion ST extends in the Y direction. Further, the width of the second circuit board portion 20 at the portion where the second transmission line 21 is located is narrower than the width of the first circuit board portion 10. As a result, the stepped portion ST extends in the X direction from the first circuit board portion 10 to a protruding portion of the second circuit board portion 20.

FIG. 3A is a cross-sectional view of the second circuit board portion 20 in the longitudinal direction, and FIGS. 3B and 3C are cross-sectional views of the second circuit board portion 20 in the width direction. Each is a diagram of the second circuit board portion 20 in a single state. In particular, FIG. 3B is a cross-sectional view of the portion where the three signal conductors SL2A, SL2B, and SL2C are sandwiched between ground conductors G21 and G22, and FIG. 3C is a cross-sectional view of the portion where terminal electrodes E21A, E21B, and E21C are located.

The second circuit board portion 20 is a multilayer substrate in which a plurality of insulating base materials S2 are stacked and which includes the second interlayer connection conductors V21A, V21B, V21C, V22B and the like. The second transmission line 21 (see FIG. 1) of the three stripline structure includes the three signal conductors SL2A, SL2B, SL2C, the ground conductors G21 and G22 sandwiching the three signal conductors in the stacked direction, and the insulating base material between them. First ends of the signal conductors SL2A, SL2B, and SL2C are conducted to the terminal electrodes E21A, E21B, and E21C via the interlayer connection conductors V21A, V21B, and V21C, respectively. Second ends of the signal conductors SL2A, SL2B, and SL2C are conducted to the terminal electrodes via interlayer connection conductors, respectively. At the cross-sectional position shown in FIG. 3A, it is shown that the second end of the signal conductor SL2B is conducted to the terminal electrode E22B via the interlayer connection conductor V22B.

The signal conductors SL2A, SL2B, and SL2C, the ground conductors G21 and G22, and the like are, for example, patterned Cu foils. Further, the second interlayer connection conductors V21A, V21B, V21C, and V22B and the like are vias formed by solidification of, for example, Cu or Sn-based conductive paste.

Openings H1 and H4 of the insulating base material S2 are located on the mounting surface (lower surface) of the second circuit board portion 20 to expose the terminal electrodes E21B, E22B, and the like. Further, openings H2 and H3 of the insulating base material S2 are located on the mounting surface of the second circuit board portion 20 to partially expose the ground conductor G21. When a protective film is provided on the insulating base material S2 so as to cover the entire or substantially the entire surface thereof, the openings H1, H2, H3, and H4 may be provided in the protective film.

FIG. 4A is a partial cross-sectional view of the first circuit board portion 10 in the Y direction. FIG. 4B is a cross-sectional view of the first circuit board portion 10 in the X direction, which is a cross-sectional view at the position of connection pads P11A, P11B, and P11C to which the terminal electrodes E21A, E21B, and E21C of the second circuit board portion 20 shown in FIG. 3C are connected.

The first circuit board portion 10 is a multilayer substrate in which a plurality of insulating base materials S1 are stacked and which includes a first interlayer connection conductor V10. As shown in FIG. 4A, connection pads P11B, P13, P14, P12B, and the like are located on the upper surface of the first circuit board portion 10. Further, as shown in FIG. 4B, the connection pads P11A, P11B, and P11C are located on the upper surface of the first circuit board portion 10.

A ground conductor G11 is located on the lower surface of the first circuit board portion 10. A ground conductor G12, a signal conductor SL11, and the like are located inside the first circuit board portion 10. The first transmission line 11 and the transmission line 12 (see FIG. 1) with a stripline structure including the signal conductors SL11 and the like, the ground conductors G11 and G12, and the insulating base material between them. The ground conductors G11 and G12 and the connection pad P14 are connected via the first interlayer connection conductor V10.

The signal conductor SL11, the ground conductors G11 and G12, and the like are, for example, patterned Cu foils. Further, the interlayer connection conductor V10 is, for example, a plating via in which Cu plating is applied in the through hole.

FIG. 5A is a partial cross-sectional view of the circuit board 101 in the Y direction, and FIG. 5B is a cross-sectional view of the circuit board 101 in the X direction. FIGS. 5A and 5B are cross-sectional views at the same position in a state where the second circuit board portion 20 is mounted on the first circuit board portion 10 shown in FIGS. 4A and 4B.

The terminal electrodes E21B, E22B, and the like of the second circuit board portion 20 are connected to the connection pads P11B, P12B, and the like of the first circuit board portion 10 via solder. Further, the ground conductor G21 of the second circuit board portion 20 passes through the openings H2 and H3 shown in FIG. 3A, and is connected to the connection pads P13 and P14 via solder, respectively. As described above, with the structure in which the electrode of the second circuit board portion 20 is connected to the connection pads of the first circuit board portion 10, besides signal input/output terminals, even if the second circuit board portion 20 is narrow or long, floating and bending, in the plane direction, of the second circuit board portion 20 with respect to the first circuit board portion 10 are reduced or prevented. Further, in the case of a structure in which the grounds are connected to each other by the electrodes other than signal input/output terminals and the connection pads of the first circuit board portion 10, the ground potential becomes more stable, and unnecessary coupling of the second transmission line and other circuits and unnecessary radiation can be further reduced or prevented.

The connection pads P11A, P11B, and P11C of the one side are connected to the transmission line 12 (see FIG. 1). The connection pads of the other side (connection pad P12B and the like) are connected to the radiation elements RE1, RE2, and RE3 (see FIG. 1) of the antennas.

With the structure shown above, the circuit board 101 in which the second circuit board portion 20 is disposed on the first circuit board portion 10 in the positional relationship in which the first transmission line 11 and the second transmission line 21 extend side-by-side with each other is configured.

FIG. 6 is a partial cross-sectional view of another circuit board 101M according to the first preferred embodiment. The configuration of portion of the first circuit board portion 10 and the second circuit board portion 20 is different from the example shown in FIG. 5. In the example shown in FIG. 6, an opening AP1 is located in the ground conductor G12 of the first circuit board portion 10, and an opening AP2 is located in the ground conductor G21 of the second circuit board portion 20. The opening AP1 and the opening AP2 are relatively close to each other, but since the first circuit board portion 10 and the second circuit board portion 20 are originally different boards, a gap GA is defined between the first circuit board portion 10 and the second circuit board portion 20 in a state where the second circuit board portion 20 is disposed on the first circuit board portion 10. Therefore, isolation between the first transmission line including the signal conductor SL11 and the like located on the first circuit board portion 10 and the second transmission line including the signal conductor SL2B and the like located on the second circuit board portion 20 is secured.

According to the present preferred embodiment, the effects listed below are exhibited.

(a) Since the first transmission line 11 for low-frequency/low-speed signals and the second transmission line 21 for high-frequency/high-speed signals include striplines of materials and structures suitable for each, predetermined transmission characteristics can be satisfied for each of the low-frequency/low-speed signals and the high-frequency/high-speed signals.

(b) At the position where the signal conductors SL2A, SL2B, and SL2C located on the second circuit board 20 face the first circuit board 10, when viewed from the signal conductors SL2A, SL2B, and SL2C, since the ground conductors G21 and G12 are interposed on the first circuit board 10 side, unnecessary coupling of the electromagnetic field radiated from the second transmission line 21 to the first transmission line 11 is reduced or prevented. Further, since the ground conductors G12 and G21 are provided between the first transmission line 11 of the first circuit board 10 and the second transmission line 21 of the second circuit board 20, isolation between the first transmission line 11 and the second transmission line 21 can be enhanced.

(c) Since the first transmission line 11 and the second transmission line 21 extend side-by-side with each other along the stacked direction of the first circuit board portion 10 and the second circuit board portion 20, the width in the plane direction of the portion where the first circuit board portion 10 and the second circuit board portion 20 overlap can be narrowed.

(d) The entirety of the second circuit board portion 20 is disposed on the first circuit board portion 10, and the second circuit board portion 20 protrudes from the first circuit board portion 10 such that the stepped portion ST is defined. Therefore, although the thickness of the portion where the first circuit board portion 10 and the second circuit board portion 20 overlap becomes relatively thick, since the second circuit board portion 20 only partially protrudes, the occupied volume of the circuit board 101 can be reduced, and the increase in the average thickness of the entire circuit board 101 can be reduced or prevented. This can contribute to miniaturization of an electronic device. Further, the width of the second circuit board portion 20 at the portion where the second transmission line 21 is located is narrower than the width of the first circuit board portion 10, and the second circuit board portion 20 protrudes from the first circuit board portion 10 such that the stepped portion ST is located. This means that since the second circuit board portion 20 only partially protrudes, the occupied volume of the circuit board 101 can be reduced, and an increase in the average thickness of the entire circuit board 101 can also be reduced or prevented. This can contribute to miniaturization of an electronic device.

(e) Since the first circuit board portion 10 is a multilayer substrate using a low-cost resin sheet such as polyimide, modified polyimide, or polyethylene terephthalate as the insulating base material S1, a low-cost circuit board portion suitable for energizing a signal of a relatively low frequency band or a direct current can be configured. Further, since the first interlayer connection conductor V10 is a metal via such as a plating via, a circuit board portion having low conductor loss and power loss can be configured. On the other hand, the second circuit board portion 20 is a multilayer substrate in which a thermoplastic resin sheet having a low dielectric constant and a low dielectric loss tangent such as liquid crystal polymer, polyether ether ketone, polytetrafluoroethylene, or the like is used as the insulating base material S2. Therefore, even in the high frequency band, a circuit board portion having a low signal transmission loss can be configured. Further, since the second interlayer connection conductors V21A, V21B, V21C, V22B and the like are vias formed by solidifying a Cu, Sn-based conductive paste, the degree of freedom in design is higher than that of plating vias. Further, the interlayer connection conductor can be freely located inside the multilayer substrate, and it is easy to realize wiring in a complicated shape in order to obtain a desired impedance.

(f) Since the first circuit board portion 10 has a higher dielectric constant and a higher dielectric loss tangent than those of the second circuit board portion 20, the electromagnetic field radiated to the outside from the first transmission line 11 with respect to the second transmission line 21 is reduced or prevented. Therefore, unnecessary coupling between the first transmission line 11 and the second transmission line 21 is reduced or prevented.

Second Preferred Embodiment

In a second preferred embodiment of the present invention, the shape of the first circuit board portion 10 and the positional relationship between the first circuit board portion 10 and the second circuit board portion 20 are different from those shown in the first preferred embodiment.

Figure 7:
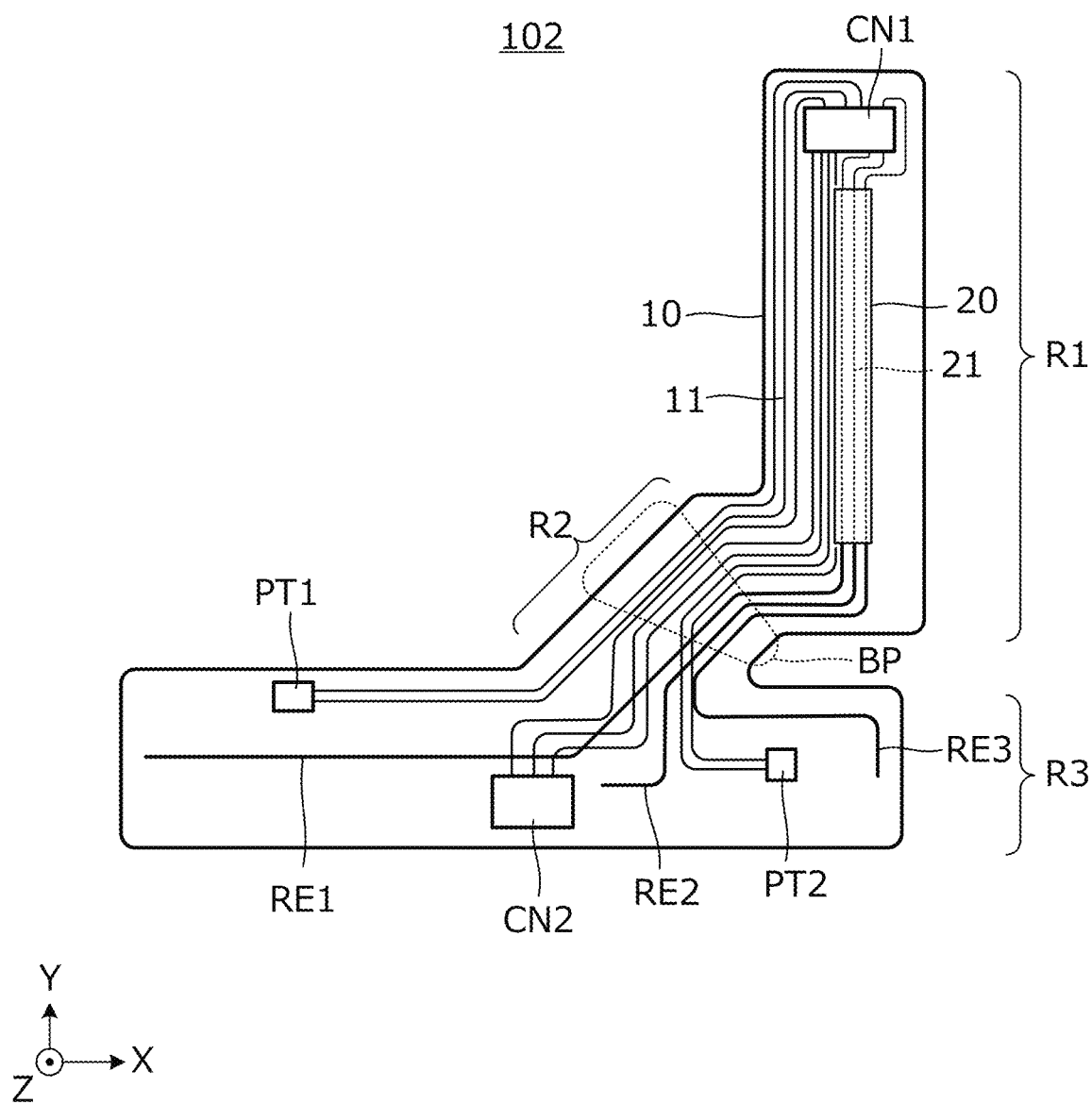
FIG. 7 is a plan view of a circuit board 102 according to a second preferred embodiment of the present invention.

FIG. 7 is a plan view of a circuit board 102 according to the second preferred embodiment. The circuit board 102 includes the first circuit board portion 10 and the second circuit board portion 20. The second circuit board portion 20 is mounted on the first circuit board portion 10.

A plurality of first transmission lines 11 for low-frequency signals or low-speed signals are located on the first circuit board portion 10. A plurality of second transmission lines 21 for high-frequency signals or high-speed signals are located on the second circuit board portion 20.

The second circuit board portion 20 is disposed on the first circuit board portion 10 in a positional relationship in which the first transmission line 11 and the second transmission line 21 extend side-by-side with each other.

The circuit board 102 can be divided into a first region R1, a second region R2, and a third region R3. The second circuit board portion 20 is mounted in the first region R1. Further, a connector (receptacle) CN1 of another circuit board is mounted in the first region R1. Furthermore, portions of radiation elements RE1, RE2, and RE3 of three antennas are located in the first region R1. The second region R2 is a region connecting the first region R1 and the third region R3, and portions of the first transmission line 11 and the radiation elements RE1, RE2, and RE3 of the three antennas are provided. The second region R2 includes a bent portion BP. Radiation elements RE1, RE2, and RE3 of three antennas are located in the third region R3. Further, other electronic components PT1 and PT2 such as a connector (receptacle) CN2 and a semiconductor integrated circuit are mounted in the third region R3.

A plurality of first transmission lines 11 connecting the connector CN1, and the connector CN2 and the electronic components PT1 and PT2, are located in the first circuit board portion 10. The first transmission line 11 is located inside the first circuit board portion 10, but FIG. 1 conceptually shows the pattern of the signal conductor of the first transmission line 11.

The configuration of the second circuit board portion 20 is the same as that shown in the first preferred embodiment. When the bent portion BP of the circuit board 102 is bent by 180 degrees, the first region R1 and the third region R3 face each other in a plane, which saves the space as a whole and is housed in an electronic device.

According to the present preferred embodiment, the first transmission line 11 and the second transmission line 21 extend side-by-side to each other so as to be aligned in the plane direction of the first circuit board portion 10 in a plan view, so that isolation between the first circuit board portion 10 and the second circuit board portion 20 is further enhanced. Further, in the portion where the first transmission line 11 and the second transmission line 21 extend side-by-side with each other most closely, since they are separated by different base materials, isolation between the first circuit board portion 10 and the second circuit board portion 20 is further enhanced.

Third Preferred Embodiment

In a third preferred embodiment of the present invention, an exemplary configuration of a main portion of an electronic device is shown.

Figure 8:
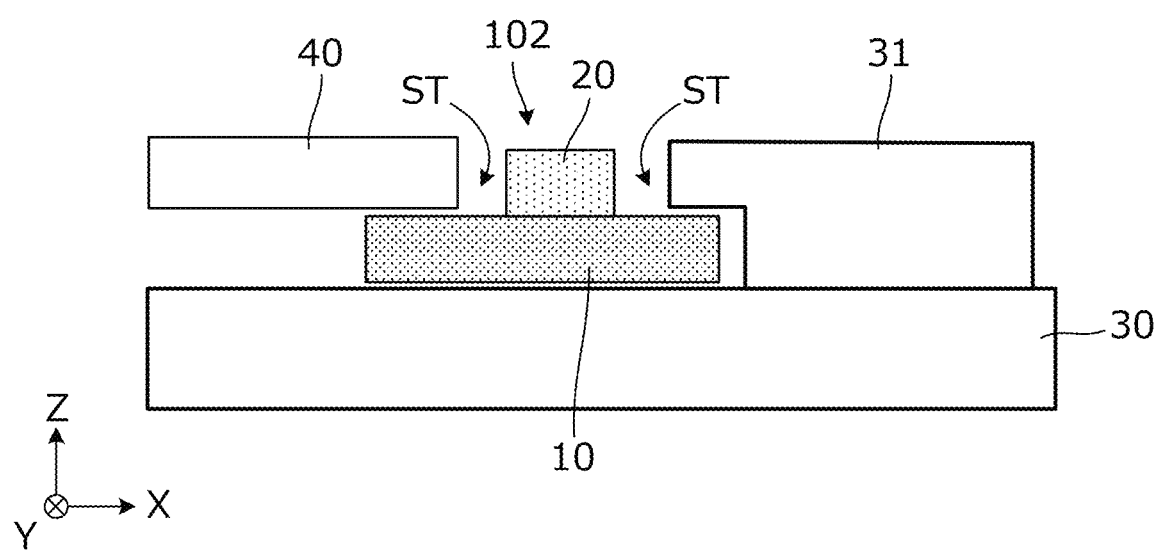
FIG. 8 is a cross-sectional view of an electronic device 201 according to a third preferred embodiment of the present invention.

FIG. 8 is a cross-sectional view of an electronic device 201 according to the third preferred embodiment. However, at this cross-sectional position, a cross-section appears only in the circuit board 102 portion.

The electronic device 201 includes a circuit board 102, housings 30 and 31 to accommodate the circuit board 102, and a component 40 accommodated in the housing.

The circuit board 102 is the circuit board 102 shown in the second preferred embodiment. FIG. 8 is a cross-sectional view taken along a surface crossing the width direction of the second circuit board portion 20, at a position where the second circuit board portion 20 is mounted in FIG. 7. The circuit board 102 includes the first circuit board portion 10 and the second circuit board portion 20, and includes stepped portions ST in the X direction. The housing 31 and the component 40 are located in the spaces defined by the stepped portions ST.

In the circuit board 102 shown in FIG. 7, the second region R2 is bent so that the third region R3 overlaps the first region R1 in a plan view, but the third region R3 is not shown in FIG. 8. The third region R3 is disposed, for example, above the housing 31 or the component 40.

According to the present preferred embodiment, the electronic device 201 having a high degree of integration can be obtained without causing a wasted space due to the stepped portion of the circuit board 102.

Fourth Preferred Embodiment

In a fourth preferred embodiment of the present invention, an example of a second circuit board portion having a structure different from that shown in the first preferred embodiment will be described.

Figure 9:
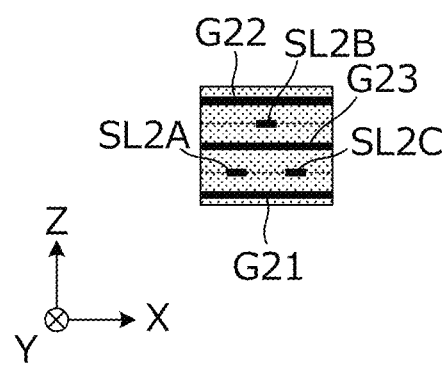
FIG. 9 is a cross-sectional view of a second circuit board portion according to a fourth preferred embodiment of the present invention.

FIG. 9 is a cross-sectional view of a second circuit board portion according to the fourth preferred embodiment. In the second circuit board portion 20 shown in FIG. 3B, three signal conductors SL2A, SL2B, and SL2C are provided on the same surface, and they are sandwiched between the ground conductors G21 and G22. On the other hand, in the fourth preferred embodiment, a ground conductor G23 is provided in addition to the ground conductors G21 and G22. Then, the signal conductors SL2A and SL2C are located between the ground conductor G21 and the ground conductor G23. Further, the signal conductor SL2B is located between the ground conductor G22 and the ground conductor G23.

The signal conductors SL2A and SL2C, the ground conductors G21 and G23 sandwiching the signal conductors in the stacked direction, and the insulating base material between them define a second transmission line having a two-stripline structure. Similarly, the signal conductor SL2B, the ground conductors G22 and G23 sandwiching the signal conductor in the stacked direction, and the insulating base material between them define a second transmission line with a one-stripline structure.

In this way, a plurality of second transmission lines may be aligned in the stacked direction of the insulating base material. Further, a plurality of second transmission lines may be shielded from each other by a ground conductor.

Fifth Preferred Embodiment

In a fifth preferred embodiment of the present invention, a circuit board having a structure different in the first circuit board portion 10 and the second circuit board portion 20 from that of the examples shown above will be described.

FIG. 10A is a cross-sectional view of a first circuit board portion 10 and a second circuit board portion 20 that are elements of a circuit board according to the fifth preferred embodiment. FIG. 10B is a cross-sectional view of a circuit board 105 according to the fifth preferred embodiment.

Unlike the example shown in FIG. 5A, a coverlay film CF1 is located on the upper surface of the first circuit board portion (the surface facing the second circuit board portion 20). Further, a coverlay film CF2 is located on the lower surface of the second circuit board portion 20 (the surface facing the first circuit board portion 10). The coverlay film CF1 is a protective film that protects the surface of the first circuit board portion 10, and the coverlay film CF2 is a protective film that protects the surface of the second circuit board portion 20.

As described above, it is preferable to provide a protective film on the surfaces facing the first circuit board portion 10 and the second circuit board portion 20. As a result, damage to the first circuit board portion 10 and the second circuit board portion 20 during processing can be prevented. Further, if the protective film has a higher dielectric constant and a higher dielectric loss tangent than those of the material of the insulating base material of the first circuit board portion 10, the electromagnetic field leaking between the first transmission line 11 and the second transmission line 21 is attenuated by the protective film, so that unnecessary coupling between the first transmission line 11 and the second transmission line 21 is further reduced or prevented.

Even if the coverlay film is provided on only one of the first circuit board portion 10 and the second circuit board portion 20, the above effect is obtained.

Sixth Preferred Embodiment

In a sixth preferred embodiment of the present invention, a circuit board having a different configuration particularly in the second transmission line 21 from the examples shown above will be described.

FIG. 11A is a cross-sectional view of a circuit board 106 according to the sixth preferred embodiment in the Y direction, and FIG. 11B is a cross-sectional view of the circuit board 106 in the X direction.

An opening AP2 is located in the ground conductor G21 below the second circuit board portion 20. In the formation range of the opening AP2, the signal conductor SL2B located in the second circuit board portion 20 is sandwiched in the stacked direction between the ground conductor G22 of the second circuit board portion 20 and the ground conductor G12 of the first circuit board portion 10. With such a structure, a stripline including the signal conductor SL2B and the like is located in an area extending from the ground conductor G22 to the ground conductor G12 in the stacked direction.

In the example shown in FIG. 11A, the ground conductor G21 conducting the connection pad P13 is provided, and the other region is provided as the opening AP2. However, the ground conductor may not be provided across the entire surface of the lower surface of the second circuit board portion 20.

According to the present preferred embodiment, the second circuit board portion 20 can be made thin. In addition, the flexibility of the second circuit board portion 20 is enhanced.

Seventh Preferred Embodiment

In a seventh preferred embodiment of the present invention, an example of a circuit board in which a functional circuit portion such as a filter portion is provided to the second circuit board portion 20 will be mainly described.

FIG. 12A is a cross-sectional view of a circuit board 107 according to the seventh preferred embodiment. The circuit board 107 includes the first circuit board portion 10 and the second circuit board portion 20 located on the first circuit board portion 10. A filter portion FP is located on the second circuit board portion 20. FIG. 12B is a plan view showing a shape of the signal conductor of the filter portion FP, a shape of the ground conductor G21, and the like. In FIG. 12B, the ground conductor G22 and the insulating base material are not shown. Among the signal conductors SL2A, SL2B, and SL2C, the signal conductor SL2B includes two capacitor portions CP and an inductor portion LP between them. The opening AP2 of the ground conductor G21 is located below the inductor portion LP.

As shown in FIG. 12A, the opening AP1 is located in the ground conductor G12 of the first circuit board portion 10 at a position facing the opening AP2. Therefore, in the inductor portion LP, the distance between the signal conductor and the ground conductor of the inductor portion LP is increased and the inductance component in the series direction is increased, such that the inductor portion LP defines and functions as an inductor portion. In the capacitor portion CP, the capacitance component generated between the ground conductors G21 and G22 is increased, such that the capacitor portion CP defines and functions as a capacitor. In this way, a C-L-C type filter is configured. Note that an L-C-L type filter or other circuits, for example, can be configured, without being limited to this example.

As shown in FIG. 12A, the first interlayer connection conductor V10 is located in the vicinity of the filter portion FP. The vicinity of the first interlayer connection conductor V10 is close to the ground potential on the circuit. The ground of the filter portion FP is to be shunted to the stable ground, but since the path from the ground of the filter portion FP to the stable ground is short, the parasitic capacitance generated between them is reduced or prevented, so that the predetermined filter characteristics can be obtained without being affected by the parasitic capacitance.

Eighth Preferred Embodiment

An eighth preferred embodiment of the present invention shows an example of a circuit board in which a functional circuit portion such as a filter is defined by the first circuit board portion 10 and the second circuit board portion 20.

Figure 13:
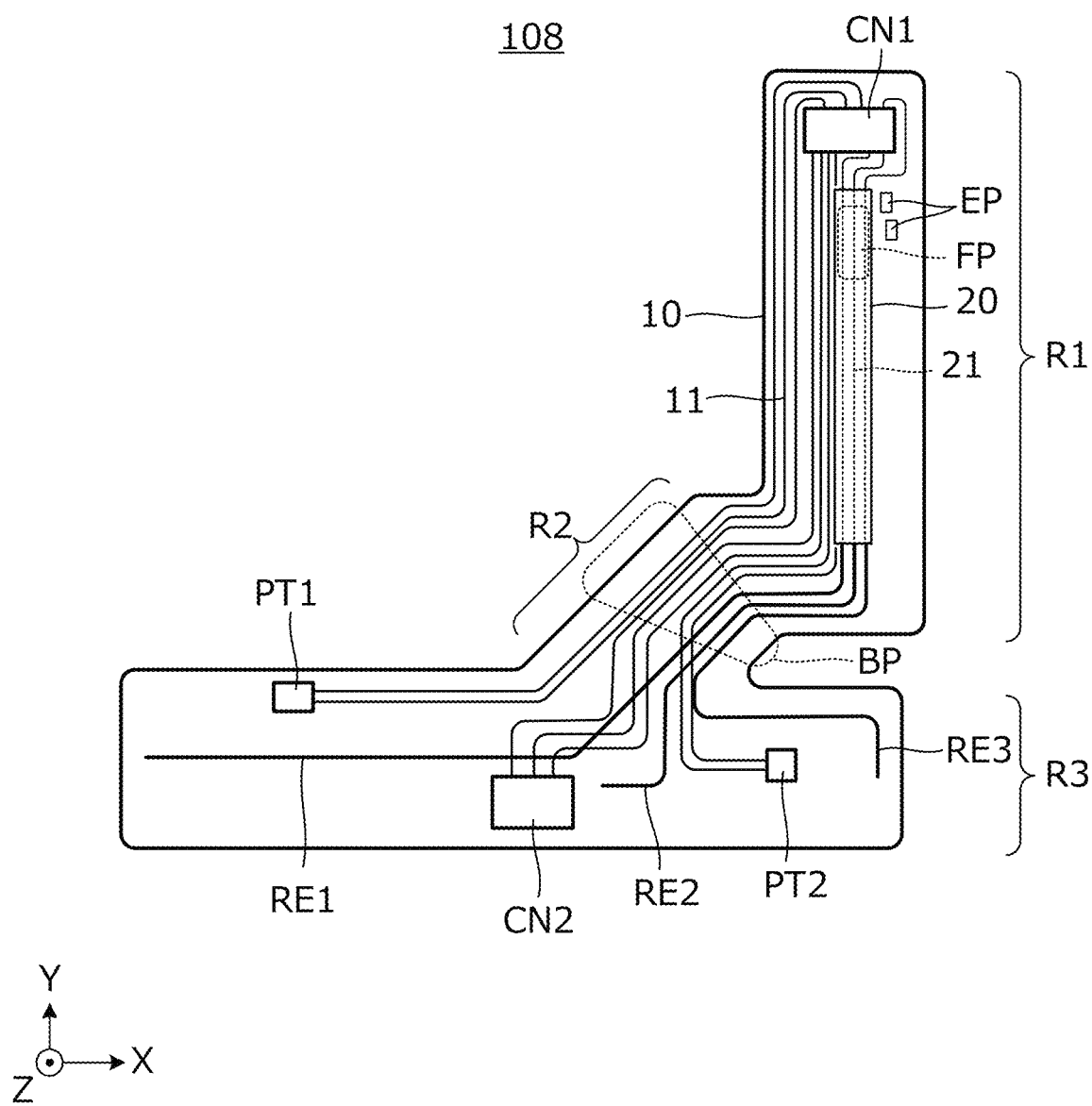
FIG. 13 is a plan view of a circuit board 108 according to an eighth preferred embodiment of the present invention.

FIG. 13 is a plan view of a circuit board 108 according to the eighth preferred embodiment. The circuit board 108 includes the first circuit board portion 10 and the second circuit board portion 20. The second circuit board portion 20 is mounted on the first circuit board portion 10.

A plurality of first transmission lines 11 for low-frequency signals or low-speed signals are located on the first circuit board portion 10. A plurality of second transmission lines 21 for high-frequency signals or high-speed signals are located on the second circuit board portion 20.

A filter portion FP is located on the second circuit board portion 20 by a conductor pattern. An external chip component EP related to the filter portion FP is mounted on the first circuit board portion 10 at a position near the filter portion FP. Other configurations are the same as those of the circuit board 102 shown in FIG. 7.

The chip component EP is, for example, a chip inductor or a chip capacitor electrically connected to the filter portion FP. The filter portion FP includes a conductor pattern, for example, as shown in FIG. 12B. External chip components can be used for, for example, fine-tuning the frequency characteristics of a filter and improving spurious characteristics. Further, a mounting electrode may be provided so that a component for such characteristic adjustment can be mounted later as needed.

Ninth Preferred Embodiment

In a ninth preferred embodiment of the present invention, a circuit board used together with other circuit boards will be illustrated.

Figure 14A:
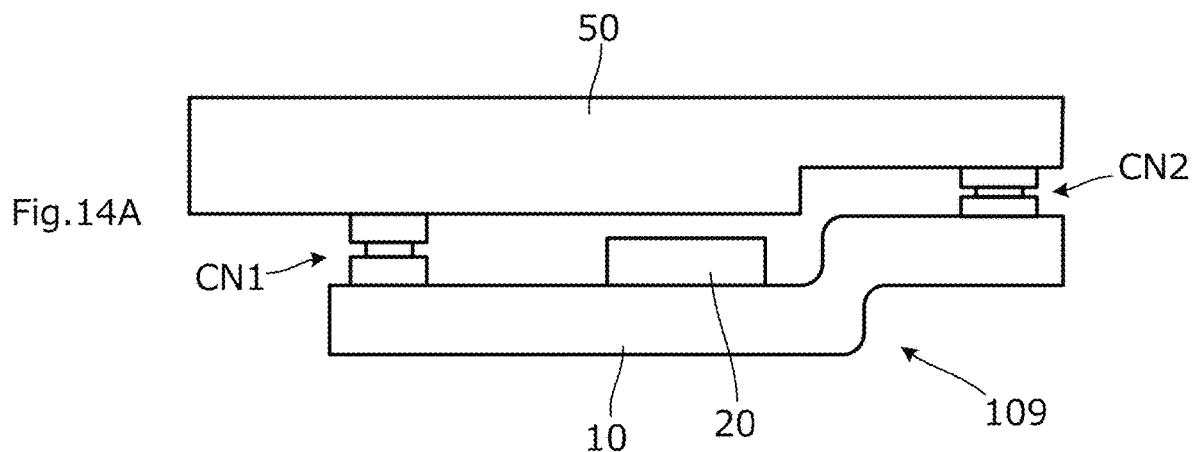
FIGS. 14A and 14B are illustrations showing a mounting structure of a circuit board 109 according to a ninth preferred embodiment of the present invention.
Figure 14B:
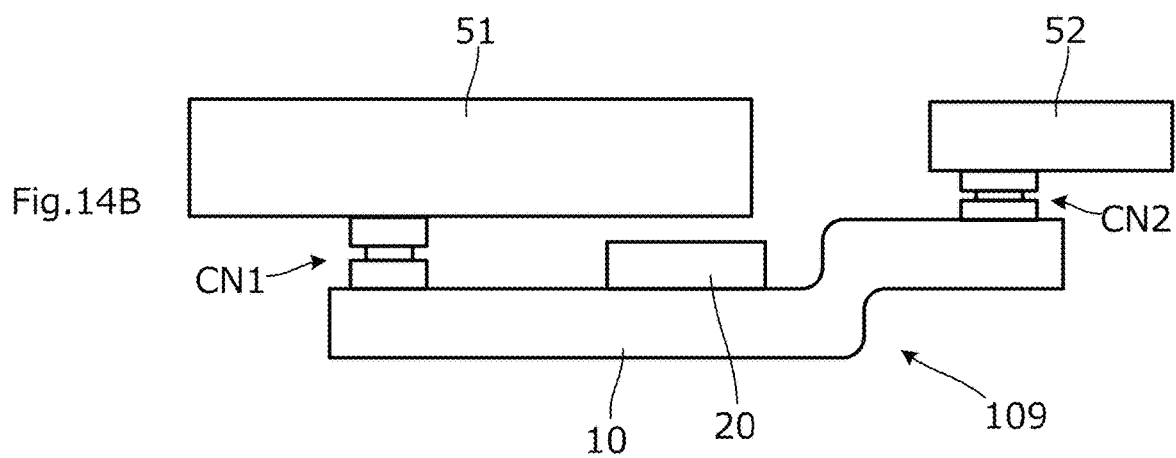

FIGS. 14A and 14B are illustrations showing the mounting structure of a circuit board 109 according to the ninth preferred embodiment. In the example shown in FIG. 14A, the second circuit board portion 20 is mounted on the first circuit board portion 10 to define the circuit board 109, and the circuit board 109 is connected to another circuit board 50 via connectors CN1 and CN2. Further, in the example shown in FIG. 14B, other circuit boards 51 and 52 are connected to the circuit board 109 via the connectors CN1 and CN2, respectively.

The first circuit board portion 10 is an inexpensive flexible board, the second circuit board portion 20 is a board having excellent high frequency characteristics, and the other circuit boards 50, 51, and 52 are inexpensive rigid boards such as FR4. As described above, a circuit board according to a preferred embodiment of the present invention can be used together with other circuit boards.

Finally, the description of the preferred embodiments described above is exemplary in all respects and is not restrictive. Modifications and changes can be made as appropriate for those skilled in the art. The scope of the present invention is shown not by the above-described preferred embodiments and modifications thereof but by the scope of claims. Further, the scope of the present invention includes changes from the preferred embodiments within the scope of the claims and the scope of the equivalents.

For example, while each of the above-described preferred embodiments illustrates a circuit board including a structure in which a single second circuit board portion 20 is mounted on the first circuit board portion 10, a plurality of second circuit board portions 20 may be mounted on the first circuit board portion 10.

Further, each of the above-described preferred embodiments shows an example of a circuit board including the first circuit board portion 10 and the second circuit board portion 20. However, a circuit board including three or more circuit board portions can be configured in the same way. For example, a third circuit board portion may be mounted on the first circuit board portion in addition to the second circuit board portion. Further, the second circuit board portion 20 may be mounted on the first circuit board portion 10, and a third circuit board portion may be further mounted on the second circuit board portion 20.

Further, each of the above-described preferred embodiments shows an example in which the second circuit board portion 20 is entirely disposed on the first circuit board portion 10. However, a structure in which a portion of the second circuit board portion 20 is disposed on (connected to) the first circuit board portion 10 is also acceptable.

Further, each of the above-described preferred embodiments shows an example in which the second circuit board portion 20 is entirely disposed on the first circuit board portion 10. However, conversely, a structure in which the first circuit board portion 10 is entirely disposed on the second circuit board portion 20 is also acceptable.

Further, each of the above-described preferred embodiments shows an example in which the width of the second circuit board portion 20 at the portion where the second transmission line 21 is located is smaller than the width of the first circuit board portion 10 at that portion. However, the width of the second circuit board portion 20 at the portion where the second transmission line 21 is located may be equal or substantially equal to the width of the first circuit board portion 10 at that portion.

Further, each of the above-described preferred embodiments shows an example in which the first circuit board portion 10 having a constant or substantially constant overall thickness is provided. However, it is possible to configure a circuit board including the first circuit board portion 10 in which a stepped portion is defined by the difference in the number of stacked insulating base materials, and the protruding height of the second circuit board portion 20 is reduced or prevented by mounting the second circuit board portion 20 on a thin portion of the first circuit board portion 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a plurality of circuit board portions including a first circuit board portion and a second circuit board portion; wherein
   the first circuit board portion is provided with a first transmission line for a low-frequency signal or a low-speed signal;
   the second circuit board portion is provided with a second transmission line for a high-frequency signal or a high-speed signal;
   the second circuit board portion is located on the first circuit board portion in a positional relationship in which the first transmission line and the second transmission line extend side-by-side with each other;
   the first circuit board portion includes connection pads, and the second circuit board portion includes at least one terminal electrode connected to at least one of the connection pads of the first circuit board portion; and
   the at least one terminal electrode is connected to the second transmission line.

2. The circuit board according to claim 1, wherein a dielectric constant of the first circuit board portion is higher than a dielectric constant of the second circuit board portion.

3. The circuit board according to claim 1, wherein the first transmission line and the second transmission line extend side-by-side with each other so as to be aligned in a plane direction of the plurality of circuit board portions in a plan view.

4. The circuit board according to claim 1, wherein the first transmission line and the second transmission line extend side-by-side with each other so as to be aligned in a stacked direction of the plurality of circuit board portions.

5. The circuit board according to claim 1, wherein the first circuit board portion is mounted on the second circuit board portion, and the second circuit board portion protrudes from the first circuit board portion, so that a stepped portion is defined, or the second circuit board portion is mounted on the first circuit board portion, and the first circuit board portion protrudes from the second circuit board portion, so that a stepped portion is defined.

6. An electronic device comprising
   the circuit board according to claim 5;
   a housing to accommodate the circuit board; and
   a component accommodated in the housing; wherein
   the housing or the component is disposed in a space defined by the stepped portion.

7. The circuit board according to claim 1, wherein
   a width of the second circuit board portion at a portion where the second transmission line is located is narrower than a width of the first circuit board portion; and
   the second circuit board portion protrudes from the first circuit board portion, so that a stepped portion is defined.

8. The circuit board according to claim 1, wherein the first circuit board portion or the second circuit board portion includes a ground conductor located between the first transmission line and the second transmission line.

9. The circuit board according to claim 1, wherein the first circuit board portion is a multilayer substrate including an insulating base material that includes a thermosetting resin sheet or a thermoplastic resin sheet, and the second circuit board portion is a multilayer substrate in which an insulating base material is made of a flexible thermoplastic resin sheet having a low dielectric constant and low dielectric loss tangent.

10. The circuit board according to claim 1, further comprising a first region including a connector, a second region, and a third region including radiation elements.

11. The circuit board according to claim 10, wherein the first region includes a bent portion.

12. The circuit board according to claim 11, wherein the bent portion has a thickness less than the second region and the third region.

13. The circuit board according to claim 10, wherein the third region includes a connector.

14. The circuit board according to claim 1, wherein the first transmission line is located inside the first circuit board portion and the second transmission line is located inside the second circuit board portion.

15. The circuit board according to claim 1, further comprising radiation elements that define a monopole antenna.

16. The circuit board according to claim 1, wherein each of the first transmission line and the second transmission line have a stripline structure and include signal conductors, ground conductors and insulating material therebetween.

17. The circuit board according to claim 1, wherein the at least one terminal electrode includes a plurality of terminal electrodes connected to the connection pads of the first circuit board portion.

18. The circuit board according to claim 1, wherein the second circuit board portion includes a ground conductor that is connected to the connection pads of the first circuit board portion.

19. A circuit board comprising:
a plurality of circuit board portions including a first circuit board portion and a second circuit board portion; wherein
the first circuit board portion is provided with a first transmission line for a low-frequency signal or a low-speed signal;
the second circuit board portion is provided with a second transmission line for a high-frequency signal or a high-speed signal;
the second circuit board portion is located on the first circuit board portion in a positional relationship in which the first transmission line and the second transmission line extend side-by-side with each other;
the first circuit board portion is a multilayer substrate in which a plurality of insulating base materials are stacked and which includes a first interlayer connection conductor;
the second circuit board portion is a multilayer substrate in which a plurality of insulating base materials are stacked and which includes a second interlayer connection conductor;
the first interlayer connection conductor is made of a metal body; and
the second interlayer connection conductor includes at least partly a solidified conductive paste.

20. A circuit board comprising:
a plurality of circuit board portions including a first circuit board portion and a second circuit board portion; wherein
the first circuit board portion is provided with a first transmission line for a low-frequency signal or a low-speed signal;
the second circuit board portion is provided with a second transmission line for a high-frequency signal or a high-speed signal;
the second circuit board portion is located on the first circuit board portion in a positional relationship in which the first transmission line and the second transmission line extend side-by-side with each other; and
the first circuit board portion includes a first ground conductor with a first opening, the second circuit board portion includes a second ground conductor with a second opening, and a gap is defined between the first circuit board portion and the second circuit board portion.

* * * * *